United States Patent
Xie et al.

(10) Patent No.: US 9,210,813 B2
(45) Date of Patent: Dec. 8, 2015

(54) PRODUCTION METHOD OF HIGH-DENSITY SIM CARD PACKAGE

(75) Inventors: Jianyou Xie, Gansu (CN); Xiaowei Guo, Gansu (CN); Wenhai He, Gansu (CN); Wei Mu, Gansu (CN); Xin Chen, Gansu (CN)

(73) Assignee: TIANSHUI HUATIAN TECHNOLOGY CO., LTD., Tianshui (CN)

( * ) Notice: Subject to any disclaimer, the term of this patent is extended or adjusted under 35 U.S.C. 154(b) by 260 days.

(21) Appl. No.: 13/883,672

(22) PCT Filed: Dec. 30, 2010

(86) PCT No.: PCT/CN2010/080542
§ 371 (c)(1),
(2), (4) Date: May 6, 2013

(87) PCT Pub. No.: WO2012/071759
PCT Pub. Date: Jun. 7, 2012

(65) Prior Publication Data
US 2013/0223018 A1    Aug. 29, 2013

(30) Foreign Application Priority Data
Nov. 30, 2010    (CN) .......................... 2010 1 0564456

(51) Int. Cl.
*H05K 3/30*    (2006.01)
*H05K 1/18*    (2006.01)
(Continued)

(52) U.S. Cl.
CPC ................. *H05K 1/181* (2013.01); *H01L 24/48* (2013.01); *H01L 24/85* (2013.01); *H05K 3/00* (2013.01);
(Continued)

(58) Field of Classification Search
CPC ..... H01L 24/48; H01L 24/85; H01L 23/3121; H01L 23/49855; H01L 25/0652; H01L 25/0657; H05K 1/181; H05K 3/00; Y10T 29/49146; Y10T 29/49155
USPC ........... 29/412, 417, 830, 832, 841, 846, 848; 257/673, 685, 773, 787; 438/113
See application file for complete search history.

(56) References Cited

U.S. PATENT DOCUMENTS 5,796,164 A * 8/1998 McGraw et al. .............. 257/679
6,624,005 B1 * 9/2003 DiCaprio et al. ............. 438/113
7,941,916 B1 * 5/2011 Hsueh et al. .................... 29/841

FOREIGN PATENT DOCUMENTS

CN    101221630    7/2008
CN    101562160    10/2009
(Continued)

*Primary Examiner* — Donghai D Nguyen
(74) *Attorney, Agent, or Firm* — Hamre, Schumann, Mueller & Larson, P.C.

(57) ABSTRACT

A high-density Subscriber Identity Module (SIM) card package and a production method thereof are provided. The SIM card package includes a substrate, an Integrated Circuit (IC) chip, a bonding wire, and a mold cap. The substrate is a two-layer, a four-layer, a six-layer or an eight-layer high-density interlinked and packaged organic laminated substrate that is manufactured through an etching-back process, and a passive device and a crystal oscillator are provided on the organic laminated substrate. Two IC chips are provided side by side, or one of the IC chips is stacked with a third IC chip, the third IC chip being respectively connected to the organic laminated substrate and the IC chip under the third IC chip by the bonding wire. The IC chip, the passive device, and the crystal oscillator are adhered to the organic laminated substrate.

5 Claims, 2 Drawing Sheets

(51) Int. Cl.
  H01L 23/00 (2006.01)
  H05K 3/00 (2006.01)
  H01L 23/31 (2006.01)
  H01L 23/498 (2006.01)
  H01L 25/065 (2006.01)

(52) U.S. Cl.
  CPC ....... *H01L 23/3121* (2013.01); *H01L 23/49822* (2013.01); *H01L 23/49855* (2013.01); *H01L 24/16* (2013.01); *H01L 24/32* (2013.01); *H01L 24/45* (2013.01); *H01L 24/73* (2013.01); *H01L 25/0652* (2013.01); *H01L 25/0657* (2013.01); *H01L 2223/6677* (2013.01); *H01L 2224/16225* (2013.01); *H01L 2224/32145* (2013.01); *H01L 2224/32225* (2013.01); *H01L 2224/45015* (2013.01); *H01L 2224/45124* (2013.01); *H01L 2224/45144* (2013.01); *H01L 2224/45147* (2013.01); *H01L 2224/4809* (2013.01); *H01L 2224/48091* (2013.01); *H01L 2224/48145* (2013.01); *H01L 2224/48227* (2013.01); *H01L 2224/48465* (2013.01); *H01L 2224/73265* (2013.01); *H01L 2224/85444* (2013.01); *H01L 2224/85447* (2013.01); *H01L 2224/85455* (2013.01); *H01L 2224/85464* (2013.01); *H01L 2225/0651* (2013.01); *H01L 2225/06506* (2013.01); *H01L 2924/014* (2013.01); *H01L 2924/0105* (2013.01); *H01L 2924/01006* (2013.01); *H01L 2924/01013* (2013.01); *H01L 2924/01029* (2013.01); *H01L 2924/01033* (2013.01); *H01L 2924/01079* (2013.01); *H01L 2924/07802* (2013.01); *H01L 2924/15313* (2013.01); *H01L 2924/19041* (2013.01); *H01L 2924/19042* (2013.01); *H01L 2924/19043* (2013.01); *H01L 2924/19105* (2013.01); *H01L 2924/30107* (2013.01); *H01L 2924/3511* (2013.01); *Y10T 29/49146* (2015.01)

(56) References Cited

FOREIGN PATENT DOCUMENTS

| | | |
|---|---|---|
| CN | 101587557 | 11/2009 |
| JP | 2010177981 | 8/2010 |

\* cited by examiner

PRODUCTION METHOD OF HIGH-DENSITY SIM CARD PACKAGE

BACKGROUND

1. Field

The present invention belongs to the technical field of Integrated Circuit (IC) packaging technologies, relates to an IC chip package, and more particularly to a high-density subscriber identity module (SIM) card package that is injection-molded on the basis of an organic laminated substrate, and in which a storage chip, an encryption chip and an RF chip are integrated; the present invention further relates to a production method of the high-density SIM card package.

2. Related Art

An SIM card is a short form of a Subscriber Identity Module, and is also referred to as a smart card or a user identification card. The SIM cards are smart chip cards with microprocessors, and are formed by such five packages as Central Processing Units (CPUs), program memories such as read-only memories (ROMs), working memories such as random access memories (RAMs), data memories such as erasable programmable read-only memories (EPROMs) or electrically erasable programmable read-only memories (E2PROMs), and serial communication units. These five packages need to be integrated in one IC; otherwise, the security thereof will be threatened.

The SIM cards store content such as information related to digital mobile phone clients and encrypted keys on computer chips, so as to identify the identity of global system for mobile communications (GSM) network clients and encrypt the voice information during communication between the clients. In the current information society, the technologies and functions of various communication devices progress with each passing day. The SIM card serving as an important component of the cell phone also develops and changes constantly. The existing SIM cards are packaged generally by using carrier tapes, are of the dimension 15 mm×25 mm×0.83 mm, and have a single function such as common mobile communications and authentications, failing to meet use requirements for more functions.

SUMMARY

To solve the problems in the prior art, the objective of the present invention is to provide a high-density SIM card package, which is of a small size, has more functions, and can meet use requirements for more functions.

Another objective of the present invention is to provide a production method of the high-density SIM card package.

To achieve the foregoing objectives, the present invention adopts the following technical solutions. A high-density SIM card package includes a substrate, an IC chip, a bonding wire, and a mold cap. The substrate is a two-layer, a four-layer, a six-layer or an eight-layer high-density interlinked and packaged organic laminated substrate 1 that is manufactured through an etching-back process, and a passive device and a crystal oscillator 11 are provided on the organic laminated substrate 1. Two IC chips are provided side by side, or two IC chips are provided side by side and one of the IC chips is stacked with a third IC chip, the third IC chip being connected to the organic laminated substrate 1 by the bonding wire and being further connected to the IC chip under the third IC chip by the bonding wire.

The present invention adopts another technical solution: a production method of the high-density SIM card package, including the following steps:

step 1: wafer grinding/sawing when a wafer is finally ground to the thickness less than or equal to 160 μm, using a CP9021B-200 dedicated grinding adhesive film with a specification being 230 mm×100 m and of the thickness being 200 μm;

when the wafer is finally ground to the thickness greater than or equal to 170 μm, using a BT-150E-KL grinding adhesive film with a specification being 230 mm×100 m and of the thickness being 150 μm; and performing sawing by using a duplex STEP cutting method;

step 2: surface mounting technology (SMT)

an SMT flow being as follows: placing on a board→solder paste printing→element mounting→taking down from the board→cleaning→reflow soldering→cleaning →taking down from the board, where in the flow, a HORIZON-03i printer, an XPF-S mounter, a PYRAMAX 100N reflow oven, and a BL-370 water cleaning machine are used;

step 3: die bonding using the two-layer, four-layer, six-layer or eight-layer high-density interlinked and packaged organic laminated substrate 1 that is manufactured through an etching-back process, and performing die bonding by using a die bonder and a multi-ejector pin multi-step jacking system; or using the two-layer, four-layer, six-layer or eight-layer high-density interlinked and packaged organic laminated substrate 1 that is manufactured through an etching-back process, and performing die bonding by using a die bonder and a multi-ejector pin multi-step jacking system; then, performing second-time die bonding by using a DB-700FL die bonder, adhering an upper-layer die to the lower-layer die, and performing baking, in an anti-delamination manner after the second-time die bonding, for 3-3.5 hours at 150° C.±5° C.;

step 4: applying the following flow: feeding→vacuumizing by closing the cavity →plasma cleaning→discharging, and performing plasma cleaning on the organic laminated substrate 1 undergoing the die bonding;

step 5: wiring bonding for a single-layer chip, adjusting the substrate temperature to 200° C.-210° C., controlling the time of each frame staying on a track to be within 4 minutes, using a W3100 OPTIMA press welder, and performing wiring bonding by using a gold wire with a diameter of Φ18 μm, Φ20 μm, or Φ23 μm; and for a stacked chip, adjusting the substrate temperature to 200° C.-210° C., controlling the time of each frame staying on a track to be within 4 minutes, using a W3100 OPTIMA press welder, and performing wiring bonding by using a gold wire with a diameter of Φ18 μm, Φ20 μm, or Φ23 μm; during the wiring bonding, first performing wiring on the lower-layer die and then on the upper-layer die;

step 6: plasma cleaning applying the following flow in sequence: feeding→vacuumizing by closing the cavity →plasma cleaning→discharging, and cleaning, by using a VSP-88D Prol plasma cleaner, the organic laminated substrate 1 undergoing the wiring bonding;

step 7: molding and post mold curing molding the substrate undergoing plasma cleaning in Step 6 by using a CEL9750HF9ZHF molding compound, controlling the mold temperature to be at 175±10° C. and the injection pressure to range from 1.0 Ton-1.5 Ton, and controlling the injection procedure by using multi-stage injection model software developed by HuaTian; then performing curing for 90 s-150 s;

step 8: performing marking through a marking method same as that in a common Land Grid Array (LGA) production, to obtain a semi-finished product; and step 9: wrapping an FC-217M-170 adhesive film on a surface of the semi-finished product obtained in step 8, and then performing cutting, to obtain the SIM card package.

The dimension of the high-density SIM card package of the present invention is 12 mm×18 mm×0.63 mm, and 2-4 chips and 1-50 passive devices are packaged therein, thereby achieving typical ultra-high density System in Package (SiP). The SIM card package of the present invention is a new-generation ultrathin and subminiature cell phone smart card (RF-SIM) package, an area thereof is reduced below 60% of the existing package, the package area of each is reduced by 42.24% in comparison with the existing product, and the size is reduced by 56.28%, that is to say, each SIM card saves 56.28% of the molding compound in comparison with the original product. Moreover, the RF-SIM package can be embedded in a plastic card sleeve, changing from a rigid package to a flexible package, thereby improving the reliability of the RP-SIM.

Figure 1:
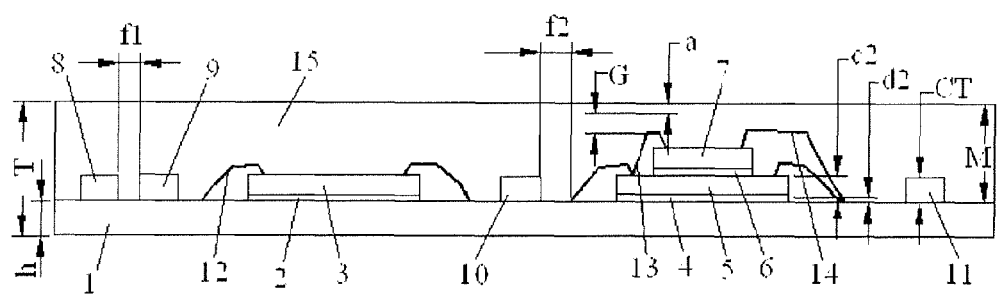
FIG. 1 is a schematic structural view showing stacking packaging of a high-density SIM card package of the present invention.

List of the numerals in the drawings: 1. organic laminated substrate, 2. first adhesive film sheet, 3. first IC chip, 4. second adhesive film sheet, 5. second IC chip, 6. third adhesive film sheet, 7. third IC chip, 8. resistor, 9. capacitor, 10. Inductor, 11. crystal oscillator, 12. first bonding wire, 13. second bonding wire, 14. third bonding wire, 15. mold cap; a. marking depth, c2. bottom die thickness, d2. bottom adhesive thickness, f1. pad to pad clearance, f2. clear bonding towards components, G. wire to mold clearance, h. substrate thickness, M. mold cap thickness, T. total die thickness, CT. passive device thickness, E1. SIM card sleeve length, E2. oblique angle limb length of the SIM card sleeve.

DETAILED DESCRIPTION

The present invention is described in detail below with reference to the accompanying drawings and the specific embodiments.

An SIM card package of the present invention is added with many strong functions on the basis of the original SIM card, and overcomes the disadvantages of security defects and single function in the existing SIM card package.

As shown in FIG. 1, a structure of stacking packaging for a high-density SIM card package of the present invention includes an organic laminated substrate 1, where the organic laminated substrate 1 is a two-layer, a four-layer, a six-layer, or an eight-layer high-density interlinked and packaged substrate, the multiple layers are interlinked by using mechanical holes and laser holes, the connection holes have forms of buried holes or blind holes, and a surface processing manner adopts copper-nickel gold plating, nickel palladium gold plating, organic protection dry film, or other surface processing manners at one side, the chip being connected to the substrate by using gold wire, copper wire, or aluminum wire ball bonding process, and adopts hard gold processing at the other side. A first IC chip 3 and a second IC chip 5 are provided on the organic laminated substrate 1 side by side, a first adhesive film sheet 2 is provided between the first IC chip 3 and the organic laminated substrate 1, and a second adhesive film sheet 4 is provided between the second IC chip 5 and the organic laminated substrate 1. An inductor 10 is provided on the organic laminated substrate 1 between the first IC chip 3 and the second IC chip 5, and a resistor 8 and a capacitor 9 are provided side by side on the organic laminated substrate 1 at another side of the first IC chip 3. A crystal oscillator 11 is provided on the organic laminated substrate 1 at another side of the second IC chip 5. The first IC chip 3 and the second IC chip 5 are each connected to the organic laminated substrate 1 by a first bonding wire 12. A third IC chip 7 is provided on the second IC chip 5, and a third adhesive film sheet 6 is provided between the third IC chip 7 and the second IC chip 5. The third IC chip 7 is connected to the organic laminated substrate 1 by a third bonding wire 14, and the third IC chip 7 is connected to the second IC chip 5 by a second bonding wire 13. A mold cap 15 is provided on the organic laminated substrate 1, and the mold cap 15 encircles all devices on the organic laminated substrate 1.

Figure 2:
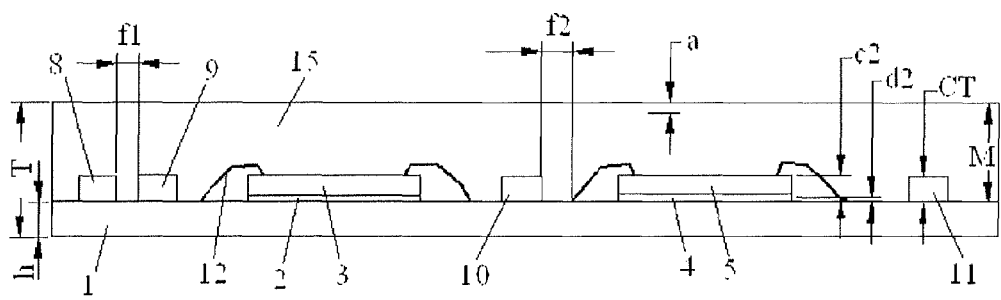
FIG. 2 is a schematic structural view showing multi-chip packaging of a high-density SIM card package of the present invention.

As shown in FIG. 2, a structure of multi-chip packaging for a high-density SIM card package of the present invention includes an organic laminated substrate 1, where the organic laminated substrate 1 is a two-layer, a four-layer, a six-layer, or an eight-layer high-density interlinked and packaged substrate, the multiple layers are interlinked by using mechanical holes and laser holes, the connection holes have forms of buried holes or blind holes, and a surface processing manner adopts copper-nickel gold plating, nickel palladium gold plating, organic protection dry film, or other surface processing manners at one side, the chip being connected to the substrate by using gold wire, copper wire, or aluminum wire ball bonding process, and adopts hard gold processing at the other side. A first IC chip 3 and a second IC chip 5 are provided on the organic laminated substrate 1 side by side, a first adhesive film sheet 2 is provided between the first IC chip 3 and the organic laminated substrate 1, and a second adhesive film sheet 4 is provided between the second IC chip 5 and the organic laminated substrate 1. An inductor 10 is provided on the organic laminated substrate 1 between the first IC chip 3 and the second IC chip 5, and a resistor 8 and a capacitor 9 are provided side by side on the organic laminated substrate 1 at another side of the first IC chip 3. A crystal oscillator 11 is provided on the organic laminated substrate 1 at another side of the second IC chip 5. The first IC chip 3 and the second IC chip 5 are each connected to the organic laminated substrate 1 by a first bonding wire 12. A mold cap 15 is provided on the organic laminated substrate 1, and the mold cap 15 encircles all devices on the organic laminated substrate 1.

The first adhesive film sheet 2, the second adhesive film sheet 4, and the third adhesive film sheet 6 may also adopt bonding adhesive.

The structure of the high-density SIM card package of the present invention includes an organic laminated substrate 1, an adhesive material, an IC chip, a bonding wire, a mold cap 15, a crystal oscillator 11, and a passive device (resistor, inductor, and capacitor). The adhesive material is provided on the organic laminated substrate 1, the IC chip is provided on the adhesive material, and a pad on the IC chip is connected to a pad on the organic laminated substrate 1 by the bonding wire to form a power supply channel and a signal channel. The mold cap 15 encircles the organic laminated substrate 1, the adhesive material, the IC chip, the bonding wire, the crystal oscillator 11, and the passive device to form a whole circuit, and supports and protects the IC chip, the bonding wire, the crystal oscillator 11, and the passive device.

The high-density SIM card package of the present invention includes multi-chip side-by-side packaging and multi-chip stacking packaging. T represents the total thickness (Total thickness) of the chips, h represents the substrate thickness (substrate thickness), f1 represents pad to pad clearance (pad to pad clearance), f2 represents clear bonding towards components (Clear bonding towards components), G represents wire to mold clearance (wire to mold clearance), a represents the marking depth (marking depth), c2 represents the bottom die thickness (btm die thickness), d2 represents the bottom adhesive thickness (btm adhesive thickness), M represents the mold cap thickness (mold cap thickness), and CT represents the passive device thickness.

The high-density SIM card package of the present invention is a new-generation high-density SIM card, and integrates a short-distance communication chip (NFC) with an SIM card, so as to achieve multiple functions such as e-payment and data downloading, which is an application expected to greatly change a lifestyle of a user. As long as the user enables the cell phone to be close to a card reader, identification applications such as micro payment, access control, and attendance can be implemented. The SIM card package supports CPCS and calypso industrial applications, PK applications, and an RSA asymmetric algorithm, has a network identity authentication function, supports real-time payment or non-real-time payment; supports functions such as air charging and remote consumption.

A production process flow of the high-density SIM card package of the present invention is as follows: wafer feeding inspection→wafer grinding→wafer sawing →substrate baking→SMT→die bonding→die baking→plasma cleaning→wiring bonding→plasma cleaning→molding→post mold curing→marking→cutting→traying inspection→testing→embedding the SIM cark package in an SIM card sleeve.

In the production of the high-density SIM card package, the organic laminated substrate 1 is used, multiple chips are integrated on the organic laminated substrate 1, 3D stacking packaging is adopted, both the bonding adhesive (conductive adhesive or insulating adhesive) sheet and the adhesive film (DAF film) sheet are provided between the chip and the substrate, and the chips are spliced together by the adhesive film sheet, to achieve 100% bonding. The adhesive film sheets are of even thickness, and are not inclined, thereby achieving high production yield. As the RF chip is thin and crisp, after repeated test, proper pressure, parameters, and wire arc types required in the wiring bonding are obtained. In the molding process, a CEL9750HF9ZHF molding compound is selected and a slanting rate of the gold wire is controlled within 5%.

The specific production method of the high-density SIM card package of the present invention is as follows.

Step 1: Wafer grinding/sawing

To prevent the wafer from warping after being ground, the following process is determined after test and estimation:

when the wafer is finally ground to the thickness less than or equal to 160 μm, using a CP9021B-200 dedicated grinding adhesive film with a specification being 230 mm×100 m and of the thickness being 200 μm;

when the wafer is finally ground to the thickness greater than or equal to 170 μm, using a BT-150E-KL grinding adhesive film with a specification being 230 mm×100 m and of the thickness being 150 μm;

for the ground chip of the thickness less than 150 μm, through anti-broking anti-warping grinding process control technologies, performing rough grinding in a range of the raw wafer thickness plus the adhesive film thickness minus 50 μm, the rough grinding speed being less than or equal to 30 μm/min; and performing fine grinding in a range of the final wafer thickness plus the adhesive film thickness plus 30 μm, the fine grinding speed being less than or equal to 10 μm/min; and performing sawing by using a duplex STEP cutting method, to avoid collapsing and cracking.

step 2: SMT

An SMT flow is as follows: placing on a board→solder paste printing→element mounting→taking down from the board→cleaning→reflow soldering→cleaning →taking down from the board; in this flow, a HORIZON-03i printer, an XPF-S mounter, a PYRAMAX 100N reflow oven, and a BL-370 water cleaner are used.

In the SMT flow, a printing process is a key in ensuring the SMT quality, during which problems such as misplaced solder paste patterns, tapered or depressed solder paste patterns, excessive solder paste amount, uniform patterns with breaking points, and polluted patterns easily appear. Therefore, manners of adjusting a steel plate position, adjusting a printer, adjusting a printing pressure, changing a metal blade, improving the template window design, checking the size of the template window, and adjusting the printing parameters are used, and optimization is constantly performed, thereby meeting product requirements.

Step 3: Die bonding

The organic laminated substrate 1 is used, where the organic laminated substrate 1 is a two-layer, a four-layer, a six-layer or an eight-layer high-density interlinked and packaged substrate, the multiple layers are interlinked by using mechanical holes and laser holes, the connection holes have forms of buried holes or blind holes, and a surface processing manner adopts copper-nickel gold plating, nickel palladium gold plating, organic protection dry film, or other surface processing manners at one side. The organic laminated substrate 1 is manufactured through an etching-back process, so as to reduce an antenna effect in the packaging. The organic laminated substrate 1 adopts a large-area pavage manner, to enhance the heat-dissipation effect and reduce the signal noise at the same time. A DB-700FL die bonder, an AD828 die bonder, or an AD889 die bonder is used, a multi-ejector pin multi-step jacking system is used during the die bonding, the ejector pin parameters are adjusted, and a packaging pressure is adjusted.

The organic laminated substrate 1 is used, where the organic laminated substrate 1 is a two-layer, a four-layer, a six-layer or an eight-layer high-density interlinked and packaged substrate, the multiple layers are interlinked by using mechanical holes and laser holes, the connection holes have forms of buried holes or blind holes, and a surface processing manner adopts copper-nickel gold plating, nickel palladium gold plating, organic protection dry film, or other surface processing manners at one side. The organic laminated substrate 1 is manufactured through an etching-back process, so as to reduce an antenna effect in the packaging. The organic laminated substrate 1 adopts a large-area pavage manner, to enhance the heat-dissipation effect and reduce the signal noise at the same time. A DB-700FL die bonder, an AD828 die bonder, or an AD889 die bonder is used, a multi-ejector pin multi-step jacking system is used during the die bonding, the ejector pin parameters are adjusted, and a packaging pressure is adjusted. A DB-700FL die bonder is used. An upper-layer die is adhered to a lower-layer die, both the bonding adhesive sheet and the adhesive film sheet can be used between the lower-layer die and the upper-layer die, and the whole is baked, in an anti-delamination manner after second-time die bonding, for 3-3.5 hours at 150° C.±5° C.

The bottom-layer die in the SIM card package is merely of the thickness 100 μm after being ground, so a cracking risk exists in the processing procedure. Engineers in charge of die bonding performs DOE repeated experiments and finally determines a solution to this problem, that is, an ejector pin with great radian R is selected, a multi-ejector pin multi-step jacking system is used, the ejector pin parameters are adjusted, and a packaging pressure is adjusted, so as to avoid cracking. During the die bonding, the adhesive film sheet (DAF film) is used for adhesion, the chip and the frame (or the chips) are fully bonded, and the thickness is uniform without deflection; so the adhesive film sheet is suitable for die bonding of small dies.

In Step 4, the following flow is applied: feeding→vacuumizing by closing the cavity →plasma cleaning→discharging, and plasma cleaning is performed on the substrate undergoing the die bonding.

Step 5: Wiring bonding

For a single-layer chip, the substrate temperature is adjusted to 200° C.-210° C., the time of each frame staying on a track is controlled to be within 4 minutes, to avoid oxidation of the frame and prevent a delamination defect. A W3100 OPTIMA press welder is used, the gold wire with a diameter being Φ18 μm, Φ20 μm or Φ23 μm and provided by providers HERAEUS and Tanaka is selected to perform the wiring bonding.

For a stacked chip, the substrate temperature is adjusted to 200° C.-210° C., the time of each frame staying on the track is controlled to be within 4 minutes, to avoid oxidation of the frame and prevent a delamination defect. A W3100 OPTIMA press welder is used, the gold wire with a diameter being Φ18 μm, Φ20 μm or Φ23 μm and provided by providers HERAEUS and Tanaka is selected to perform the wiring bonding. During the wiring bonding, the wiring is completed through two steps; first the wiring is performed on the lower-layer die and then on the upper-layer die.

A storage chip, an encryption chip, and a RF chip are integrated in the high-density SIM card package, the chips are made of NOK materials and are thin and crisp accordingly.

Figure 3:
FIG. 3 is a schematic arc view of a flat arc used by an inter-chip bonding wire and a long arc line during wiring bonding in a production procedure of the high-density SIM card package of the present invention.
Figure 4:
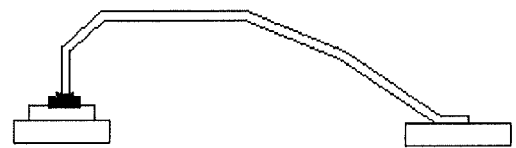
FIG. 4 is a schematic arc view of a Bga arc used by a long wire arc of a length exceeding 2 mm during wiring bonding in a production procedure of the high-density SIM card package of the present invention.
Figure 5:
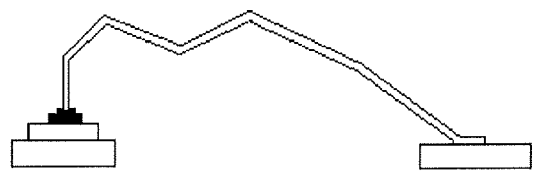
FIG. 5 is a schematic arc view of an M arc used in the case of many bonding wires and limited arc height during wiring bonding in a production procedure of the high-density SIM card package of the present invention.
Figure 6:
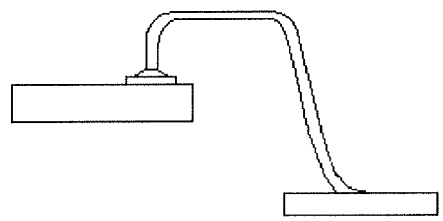
FIG. 6 is a schematic arc view of a chip scale package (CSP) arc used between chips during wiring bonding in a production procedure of the high-density SIM card package of the present invention.

The chips are easily cracked due to pressure during the wiring, so the wiring is difficult; as a result, the wiring needs to be performed according to the proper parameters and wire arc types that are obtained through a DOE test by TianSheng engineers. The ultra-thinness of the chip defines that the wire arc height should be controlled within 120 μm, and when the bonding wire stretches across the chips or a long wire arc exists, a flat arc (a platform arc or a working arc) shown in FIG. 3 is used. When the wire arc is a long wire arc exceeding 2 mm, a Bga arc shown in FIG. 4 is used, and 2-4 corners exist in the arc. When many bonding wires exist and the arc height is limited, an M arc shown in FIG. 5 is used, so as to prevent contact between the lower-layer bonding wires. A short wire arc or a CSP arc (a space between the solder joints is small and the drop is large) shown in FIG. 6 is used between the chips, and a pressure surface corner of the bonding wire between the chip and the substrate can be adjusted in height according to the requirements.

Step 6: Plasma cleaning

The following flow is applied in sequence: feeding→vacuumizing by closing the cavity→plasma cleaning→discharging, and the substrate undergoing the wiring bonding is cleaned by using a VSP-88D Prol plasma cleaner, to remove the impurities on the surfaces of the substrates, chips and devices.

Step 7: Molding and post mold curing

The substrate undergoing plasma cleaning in Step 6 is molded by using a CEL9750HF9ZHF molding compound, the mold temperature is controlled to be at 175±10° C. and the injection pressure is controlled to range from 1.0 Ton-1.5 Ton; the injection procedure is controlled by using a multi-stage injection model software developed by HuaTian; then curing is performed for 90 s-150 s.

The SIM card packaging is thin and single-side packaging, one side being the molding compound, and the other side being the substrate. Since it is not equivalent packaging, warping incurred by inconsistent contraction of the packaging materials occurs under the effect of a thermal stress after the molding, in the post mold curing and baking procedures, the warping is controlled by increasing a ballast, and slowly rising and reducing the temperature; as a result, the warping can be controlled at 0.15 mm (smile) or 0.10 mm (cry) after the control measures.

Step 8: Marking

Marking is performed through a marking method same as that in a common LGA production, to obtain a semi-finished product.

Step 9. Cutting and traying

An FC-217M-170 adhesive film with strong adhesion is wrapped on the surface of the semi-finished product obtained in Step 8, and then the whole is cut to obtain an SIM card package of the dimension 12 mm×18 mm×0.63 mm.

The size of the obtained SIM card package is small and the thickness is thin, die drop and offset phenomenon easily occur in the cutting. To solve these problems, the adhesive film with strong adhesion is used, and the mounting process is improved by controlling the warping degree of the material, so that the product can be closely adhered to the UV film without air bubbles and sand holes. A CSP calibration mode is selected, and a multi-point calibration function is used; a cutting sequence command is changed through programming, thereby changing radial stresses at different positions to alleviate the product displacement.

The obtained SIM card package is embedded in the SIM card sleeve, and the specific flow thereof is as follows: trimming→notching→stacking→placing the adhesive film→placing the SIM card package→hot-pressing→forming→cutting→packing→providing to telecom operators, to achieve high-density packaging and highly integrating.

The high-density SIM card packaging technology of the present invention differs from the existing SIM card packaging in the following aspects.

1) The organic laminated substrate is a two-layer, a four-layer, a six-layer or an eight-layer high-density interlinked and packaged substrate, the multiple layers are interlinked by using mechanical holes and laser holes, the connection holes have forms of buried holes or blind holes, a surface processing manner adopts copper-nickel gold plating, nickel palladium gold plating, organic protection dry film, or other surface processing manners at one side, and the substrate is manufactured through an etching-back process, thereby reducing the antenna effect in the packaging.

2) Multiple chips are molded, various forms such as side-by-side arrangement and stacking arrangement are adopted in the multi-chip packaging, and the chips are interconnected through the wires on the organic laminated substrate or directly through gold wires, copper wires or aluminum wires.

3) Multiple passive devices are molded, and the arrangement of the passive devices match the mold flow direction, thereby effectively reducing molding cavities and molding turbulences.

4) The injection molding is performed to protect the multi-chip wire arc, the chip, and the passive devices.

5) The area of the SIM card package is 57.6% of the conventional SIM card, the SIM card package is embedded into a PVC card sleeve after the completion of the package, thereby achieving high-density packaging and highly integrating.

6) The storage chip, the encryption chip, and the RF chip are integrated, and the antenna is attached on the packaging substrate; therefore, non-contact payment can be achieved.

7) The chip is connected to the substrate in multiple interconnection manners such as wiring with gold wires and flip chip welding.

8) The crystal oscillator is further integrated, and a stacking packaging (PiP) process is adopted.

9) A large-area pavage manner is used in the substrate design, thereby enhancing the heat-dissipation effect and reducing the signal noise.

10) The adhesive between the chip and the substrate has many forms such as adhesive film sheet, conductive adhesive, and insulating adhesive.

Embodiment 1

The wafer is finally ground to the thickness of 145 μm, a CP9021B-200 dedicated grinding adhesive film with a specification being 230 mm×100 m and of the thickness being 200 μm is used. Through anti-broking anti-warping grinding process control technologies, rough grinding is performed in a range of the raw wafer thickness plus adhesive film thickness minus 50 μm, the rough grinding speed being less than or equal to 30 μm/min; and fine grinding is performed in a range of the final wafer thickness plus adhesive film thickness plus 30 μm, the fine grinding speed being less than or equal to 10 μm/min. Sawing is performed by using a duplex STEP cutting method, to avoid collapsing and cracking. A HORIZON-03i printer, an XPF-S mounter, a PYRAMAX 100N reflow oven, and a BL-370 water cleaner are respectively used, and SMT is performed on the ground wafer in a flow of placing on a board→solder paste printing→element mounting→taking down from the board→cleaning→reflow soldering→cleaning→taking down from the board. An organic laminated substrate manufacturing through an etching-back process is taken, and the wafer undergoing SMT is adhered to the organic laminated substrate by using a DB-700FL die bonder, to perform die bonding. Plasma cleaning is performed on the organic laminated substrate undergoing the die bonding. Wiring bonding is performed on the organic laminated substrate undergoing the plasma cleaning, the substrate temperature is adjusted to 200° C., the time of each frame staying on a track is controlled to be within 4 minutes, to avoid oxidation of the frame and prevent a delamination defect. A W3100 OPTIMA press welder is used, a gold wire with a diameter of Φ18 μm is selected, and the height of the wire arc is controlled within 120 μm. When the bonding wire stretches across the chips or a long wire arc exists, a flat arc is used; when the wire arc is a long wire arc exceeding 2 mm, a Bga arc is used, and 2-4 corners exist in the arc; and when many bonding wires exist and the arc height is limited, an M arc is used, so as to prevent contact between the lower-layer bonding wires. A CSP arc is used between chips, and a pressure surface corner of the bonding wire between the chip and the substrate can be adjusted in height according to the requirements. The substrate undergoing the wiring bonding is cleaned by using a VSP-88D Prol plasma cleaner, to remove the impurities on the surfaces of the substrate, the chips and the devices. The substrate undergoing the plasma cleaning is molded by using a CEL9750HF9ZHF molding compound, the mold temperature is controlled to be at 175° C. and the injection pressure is controlled at 1.0 Ton;

the injection procedure is controlled by using multi-stage injection model software developed by HuaTian; then curing is performed for 90 s. Marking is performed through a marking method same as that in a common WA production, to obtain a semi-finished product. An FC-217M-170 adhesive film with strong adhesion is wrapped on the surface of the semi-finished product, and then the whole is cut to obtain an SIM card package of the dimension 12 mm×18 mm×0.63 mm.

Embodiment 2

In the production of the multi-chip stacking SIM card package, wafer grinding and sawing, and SMT are performed by using the method same as that in Embodiment 1. In the first-time die bonding, the substrate temperature is adjusted to 210° C., and then the first-time die bonding is performed by using the method in Embodiment 1. A DB-700FL die bonder is used after the first-time die bonding, and an upper-layer die is adhered to the lower-layer die with bonding adhesive; after the second-time die bonding, the whole is baked, in an anti-delamination manner, for 3.25 hours at 150° C., and plasma cleaning is performed. A W3100 OPTIMA press welder is used, and a gold wire with a diameter of Φ20 μm is selected. First, wiring is performed on the lower-layer die and then on the upper-layer die, and the shape of the wire arc and the height thereof are controlled. The plasma cleaning is performed after the wiring bonding, and the molding is performed by using a CEL9750HF9ZHF molding compound; the mold temperature is controlled to be at 175° C., the injection pressure is controlled at 1.5 Ton, and the injection procedure is controlled by using multi-stage injection model software developed by HuaTian; then curing is performed for 90 s. The molding, marking, and cutting are performed through the method in Embodiment 1, to obtain an SIM card package of the dimension 12 mm×18 mm×0.63 mm.

Embodiment 3

In the production of the multi-chip stacking SIM card package, wafer grinding and sawing, and SMT are performed through the method same as that in Embodiment 1. In the first-time die bonding, the substrate temperature is adjusted to 205° C., and then the first-time die bonding is performed by using the method in Embodiment 1. A DB-700FL die bonder is used after the first-time die bonding, and an upper-layer die is adhered to the lower-layer die with an adhesive film sheet; after the second-time die bonding, the whole is baked, in an anti-delamination manner, for 3 hours at 155° C., and plasma cleaning is performed. A W3100 OPTIMA press welder is used, and a gold wire with a diameter of Φ23 μm is selected. First, wiring is performed on the lower-layer die and then on the upper-layer die, and the shape of the wire arc and the height thereof are controlled. The plasma cleaning is performed after the wiring bonding, and the molding is performed by using a CEL9750HF9ZHF molding compound;

the mold temperature is controlled to be at 185° C., the injection pressure is controlled at 1.25 Ton, and the injection procedure is controlled by using multi-stage injection model software developed by HuaTian; then curing is performed for 120 s. The molding, marking, and cutting are performed through the method in Embodiment 1, to obtain an SIM card package of the dimension 12 mm×18 mm×0.63 mm.

Embodiment 4

In the production of the multi-chip stacking SIM card package, wafer grinding and sawing, and SMT are performed through the method same as that in Embodiment 1. In the first-time die bonding, the substrate temperature is adjusted to 205° C., and then the first-time die bonding is performed by using the method in Embodiment 1. A DB-700FL die bonder is used after the first-time die bonding, and an upper-layer die is adhered to the lower-layer die with an adhesive film sheet; after the second-time die bonding, the whole is baked, in an anti-delamination manner, for 3.5 hours at 145° C., and plasma cleaning is performed. A W3100 OPTIMA press welder is used, and a gold wire with a diameter of Φ23 µm is selected. First, wiring is performed on the lower-layer die and then on the upper-layer die, and the shape of the wire arc and the height thereof are controlled. The plasma cleaning is performed after the wiring bonding, and the molding is performed by using a CEL9750HF9ZHF molding compound; the mold temperature is controlled to be at 185° C., the injection pressure is controlled at 1.25 Ton, and the injection procedure is controlled by using multi-stage injection model software developed by HuaTian; then curing is performed for 120 s. The molding, marking, and cutting are performed through the method in Embodiment 1, to obtain an SIM card package of the dimension 12 mm×18 mm×0.63 mm.

What is claimed is:

1. A production method of a high-density subscriber identity module (SIM) card package, comprising the following steps:
    step 1: wafer finding and sawing,
    when a wafer is finally ground to a thickness less than or equal to 160 µm, using a CP9021B-200 dedicated grinding adhesive film with a specification being 230 mm×100 m and of the thickness being 200 µm;
    when the wafer is finally ground to the thickness greater than or equal to 170 µm, using a BT-150E-KL grinding adhesive film with a specification being 230 mm×100 m and of the thickness being 150 µm; and
    performing sawing by using a duplex STEP cutting method to form ground chip;
    step 2: surface mounting technology (SMT)
    an SMT flow being as follows: placing a steel plate on a board; printing solder paste onto the board; mounting elements onto the board; removing the steel plate from the board; cleaning the board; reflowing the solder paste; and cleaning the board
    step 3: die bonding
    using a two-layer, four-layer, six-layer or eight-layer high-density interlinked and a packaged organic substrate as a laminated substrate that is manufactured through an etching-back process, and performing die bonding by using a die bonder and a multi-ejector pin multi-step jacking system to die bond the ground chip to the laminated substrate; or
    using a two-layer, four-layer, six-layer or eight-layer high-density interlinked and a packaged organic substrate as a laminated substrate that is manufactured through an etching-back process, and performing die bonding by using a die bonder and a multi-ejector pin multi-step jacking system to die bond the ground chip to the laminated substrate; then, performing second-time die bonding by using a DB-700FL die bonder, adhering an upper-layer die to a lower-layer die, and performing baking, in an anti-delamination manner after the second-time die bonding, for 3-3.5 hours at 150° C.±5° C.;
    step 4: applying the following flow: feeding the laminated substrate undergoing the die bonding to a plasma cleaning cavity; closing and vacuumizing the cavity; performing plasma cleaning on the organic laminated substrate; and discharged the laminated substrate;
    step 5: wiring bonding
    for a single-layer chip, adjusting a substrate temperature to 200° C.-210° C., controlling the time of each frame staying on a track to be within 4 minutes, and performing wiring bonding by using a gold wire with a diameter of Φ18 µm, Φ20 µm, or Φ23 µm; and
    for a stacked chip, adjusting the substrate temperature to 200° C.-210° C., controlling the time of each frame staying on a track to be within 4 minutes, and performing wiring bonding by using a gold wire with a diameter of Φ18 µm, Φ20 µm, or Φ23 µm; during the wiring bonding, first performing wiring on the lower-layer die and then on the upper-layer die;
    step 6: plasma cleaning
    applying the following flow in sequence: feeding the laminated substrate undergoing the wiring bonding to a plasma cleaning cavity: closing and vacuuming the cavity; performing plasma cleaning on the organic laminated substrate: and discharged the laminated substrate;
    step 7: molding and post mold curing
    molding the substrate undergoing plasma cleaning in Step 6, controlling a mold temperature to be at 175±10° C. and an injection pressure to range from 1.0 Ton-1.5 Ton, and controlling the injection procedure by using multi-stage injection model software; then performing curing for 90 s-150 s;
    step 8: performing marking on the molded laminated substrate through marking through a marking method same as that in a common Land Grid Array (LGA) production, to obtain a semi-finished product; and
    step 9: wrapping an FC-217M-170 adhesive film on a surface of the semi-finished product obtained in Step 8, and then performing cutting, to obtain the SIM card package.

2. The production method of the high-density SIM card package according to claim 1, wherein in Step 1, for the ground chip of the thickness less than 150 µm, through anti-broking anti-warping grinding process control technologies, rough grinding is performed in a range of the raw wafer thickness plus adhesive film thickness minus 50 µm, the rough grinding speed being less than or equal to 30 µm/min; and fine grinding is performed in a range of the final wafer thickness plus adhesive film thickness plus 30 µm, the fine grinding speed being less than or equal to 10 µm/min.

3. The production method of the high-density SIM card package according to claim 1, wherein in Step 5, a height of a wire arc after the wiring is less than or equal to 120 µm.

4. The production method of the high-density SIM card package according to claim 1, wherein in Step 5, a wire arc after the wiring comprises a flat arc, a Bga arc, an M arc, and a CSP arc.

5. The production method of the high-density SIM card package according to claim 1, wherein in Step 9, the dimension of the manufactured SIM package is 12 mm×18 mm×0.63 mm.

* * * * *